United States Patent
Choi et al.

(10) Patent No.: US 10,312,862 B2
(45) Date of Patent: Jun. 4, 2019

(54) UP-DOWN CONVERTER

(71) Applicant: SOLiD, INC., Seongnam-si, Gyeonggi-do (KR)

(72) Inventors: Jaehun Choi, Anyang-si (KR); Kyungeun Han, Suwon-si (KR)

(73) Assignee: SOLiD, INC., Seongnam-si (KR)

( * ) Notice: Subject to any disclaimer, the term of this patent is extended or adjusted under 35 U.S.C. 154(b) by 18 days.

(21) Appl. No.: 15/540,682

(22) PCT Filed: Dec. 30, 2015

(86) PCT No.: PCT/KR2015/014536
§ 371 (c)(1),
(2) Date: Sep. 14, 2017

(87) PCT Pub. No.: WO2016/108649
PCT Pub. Date: Jul. 7, 2016

(65) Prior Publication Data
US 2018/0191304 A1 Jul. 5, 2018

(30) Foreign Application Priority Data
Dec. 30, 2014 (KR) .................. 10-2014-0194358

(51) Int. Cl.
*H03D 7/16* (2006.01)
*H03D 7/18* (2006.01)
*H04B 1/30* (2006.01)

(52) U.S. Cl.
CPC ............. *H03D 7/16* (2013.01); *H03D 7/161* (2013.01); *H03D 7/18* (2013.01); *H04B 1/30* (2013.01)

(58) Field of Classification Search
CPC ............. H04L 27/22; H04L 2027/0067; H04L 25/067; H04L 27/14
See application file for complete search history.

(56) References Cited

U.S. PATENT DOCUMENTS 6,166,533 A * 12/2000 Musha ................. G01R 23/173
324/76.22
6,185,201 B1 * 2/2001 Kiyanagi ................. H04B 1/40
370/343

(Continued)

FOREIGN PATENT DOCUMENTS

KR 20-0401430 Y1 11/2005

OTHER PUBLICATIONS

Notice to Submit Response for corresponding Korean Patent Application No. 10-2014-0194358, dated Nov. 21, 2016.
(Continued)

*Primary Examiner* — Shuwang Liu
*Assistant Examiner* — Gina M McKie
(74) *Attorney, Agent, or Firm* — Sughrue Mion, PLLC

(57) ABSTRACT

According to an embodiment of the inventive concept, an up-down converter includes a first mixer configured to convert an input radio frequency (RF) signal into an intermediate frequency (IF) signal using a first local signal; an IF filter configured to filter the IF signal converted by the first mixer; a second mixer configured to convert the IF signal, which has been filtered by the IF filter, into an output RF signal using a second local signal; and a local oscillator configured to control a frequency of the first local signal and the second local signal based on a frequency of the input RF signal.

7 Claims, 4 Drawing Sheets

(56) References Cited

U.S. PATENT DOCUMENTS

| | | | | |
|---|---|---|---|---|
| 6,600,906 B1* | 7/2003 | Roppongi | ............. | H03D 7/163 |
| | | | | 327/355 |
| 2009/0156155 A1* | 6/2009 | Krug | ........................ | H04B 1/28 |
| | | | | 455/313 |
| 2010/0244903 A1* | 9/2010 | Easton | ................... | H03D 7/163 |
| | | | | 327/105 |
| 2014/0143929 A1* | 5/2014 | Curran | ................... | A41D 27/14 |
| | | | | 2/69 |

OTHER PUBLICATIONS

International Search Report for PCT/KR2015/014536, dated Apr. 25, 2016.

* cited by examiner

UP-DOWN CONVERTER

CROSS-REFERENCE TO RELATED APPLICATIONS

This application is a National Stage of International Application No. PCT/KR2015/014536, filed Dec. 30, 2015, and claims priority from Korean Patent Application No. 10-2014-0194358, filed Dec. 30, 2014, the contents of which are incorporated herein by reference in their entireties.

BACKGROUND

1. Field

The inventive concept relates to an up-down converter, and more particularly, to up-down converter for controlling the frequency of a first local signal and a second local signal based on a frequency of an input radio frequency (RF) signal.

2. Description of the Related Art

FIG. 1 is a schematic block diagram of part of a communication device including a conventional up-down converter. FIG. 2 is a diagram of frequency bands processed by the up-down converter shown in FIG. 1. Here, the communication device is a repeater capable of radio transmission, such as a node unit of a distributed antenna system, a radio frequency (RF) repeater, or an interference cancellation system (ICS) repeater.

Referring to FIGS. 1 and 2, to perform signal processing, such as intermediate frequency (IF) conversion, on a plurality of frequency bands (e.g., RB1, RB2, and RB3), a conventional communication device 10 requires up-down converters (e.g., 11, 12, and 13) for the respective frequency bands RB1, RB2, and RB3.

Accordingly, despite the fact that the up-down converters 11, 12, and 13 have substantially the same structures which include a control circuit, a local oscillator, a first local filter, a second local filter, a first RF filter, a second RF filter, a first mixer, a second mixer, and a first IF filter, parameters (e.g., a central frequency and a bandwidth) need to be designed different among the structures so that different frequency bands can be processed. This results in an unnecessary waste of expense and time during design and manufacturing. In addition, it is inconvenient to separately manage the up-down converters 11, 12, and 13 during the operation of the communication device 10.

SUMMARY

The present invention provides an up-down converter for controlling the frequency of a first local signal and a second local signal based on a frequency of an input radio frequency (RF) signal, thereby operating in a plurality of frequency bands in a communication device.

According to an aspect of the present invention, an up-down converter includes a first mixer configured to convert an input radio frequency (RF) signal into an intermediate frequency (IF) signal using a first local signal; an IF filter configured to filter the IF signal converted by the first mixer; a second mixer configured to convert the IF signal, which has been filtered by the IF filter, into an output RF signal using a second local signal; and a local oscillator configured to control a frequency of the first local signal and the second local signal based on a frequency of the input RF signal.

According to an exemplary embodiment, the up-down converter may perform an operation on the input RF signal comprising a plurality of frequency bands.

According to an exemplary embodiment, the up-down converter may further include a first local filter configured to filter the first local signal and to provide a filtered first local signal to the first mixer; and a second local filter configured to filter the second local signal and to provide a filtered second local signal to the second mixer.

According to an exemplary embodiment, the local oscillator may control the frequency of the first local signal and the second local signal based on the input RF signal according to a control signal output from a control circuit.

According to an exemplary embodiment, the up-down converter may further include a first RF filter configured to filter the input RF signal and to transmit a filtered input RF signal to the first mixer; and a second RF filter configured to filter out an image frequency from the output RF signal.

According to an exemplary embodiment, each of the first and second RF filters may pass all of the plurality of frequency bands.

According to an exemplary embodiment, a bandwidth of the IF filter may be the same as or greater than a bandwidth of a frequency band having the greatest bandwidth among the plurality of frequency bands.

According to an exemplary embodiment, the local oscillator may control the frequency of the first local signal and the second local signal so that a partial frequency section of a filtering band to which the input RF signal belongs is passed, where the partial frequency section may be at a side of a frequency band nearest to a frequency band of the input RF signal.

According to an exemplary embodiment, a width of the partial frequency section may be the same as a bandwidth of the frequency band of the input RF signal.

According to embodiments of the inventive concept, an up-down converter controls the frequency of a first local signal and a second local signal based on a frequency of an input radio frequency (RF) signal, thereby operating in a plurality of frequency bands. Accordingly, various types of communication devices in which the up-down converter is mounted can be easily designed and manufactured to provide multiband support; the convenience of management is increased.

BRIEF DESCRIPTION OF THE FIGURES

The drawings referred to in the detailed description of the present invention set forth below will be briefly described.

DETAILED DESCRIPTION OF EXEMPLARY EMBODIMENTS

The inventive concept may include various modifications and different embodiments. The detailed description will be set forth with reference to the drawings showing specific embodiments. However, the inventive concept will not be restricted to specifically disclosed features but will include any modifications, equivalents, or substitutes that do not depart from the spirit and scope of the present invention.

In the description of the inventive concept, when the detailed description of the known technology in the related art may blur the gist of the present invention, the detailed description will be omitted. Although terms such as first, second and the like may be used in the description of the embodiments, these terms are only used to distinguish one element from another.

It will be understood that when an element is referred to as being "connected" or "coupled" to another element, it can be directly connected or coupled to the other element or intervening elements may be present unless otherwise defined.

As used herein, terminology such as "part (or unit)", "~or", "~er", and "module" may indicate a unit which processes at least one function or operation and may be implemented by hardware, software, or a combination thereof.

It should be clearly understood that elements are just defined by their main functions. In detail, two or more elements may be integrated into one element or one element may be divided into two or more elements by their subdivided functions. Each of the elements which will be described below may partially or fully perform the function of another element in addition to its own main function and part of the main function of each element may be exclusively performed by another element.

Hereinafter, embodiments of the inventive concept will be described in detail.

Figure 1:
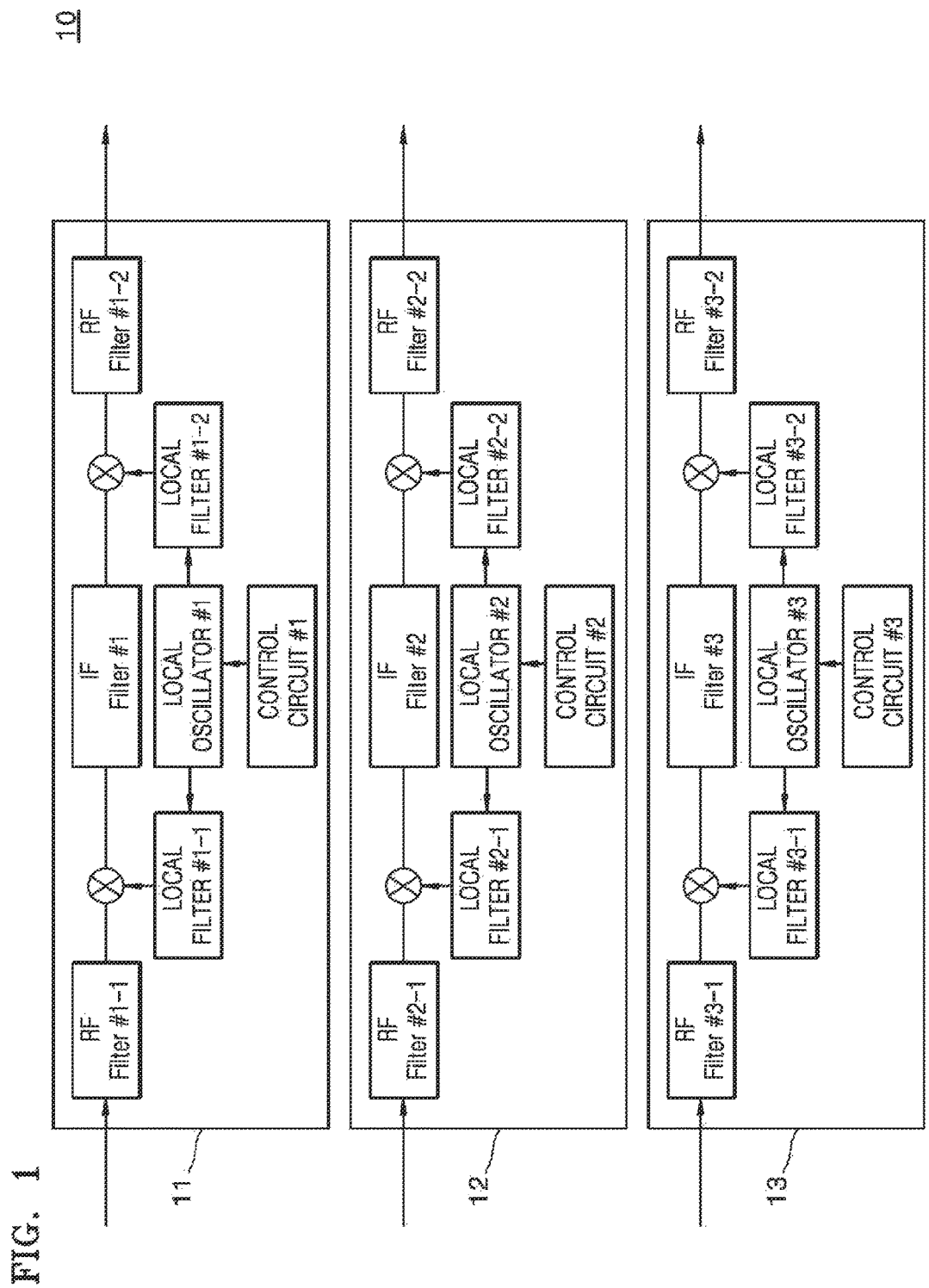
FIG. 1 is a schematic block diagram of part of a communication device including a conventional up-down converter.
Figure 2:
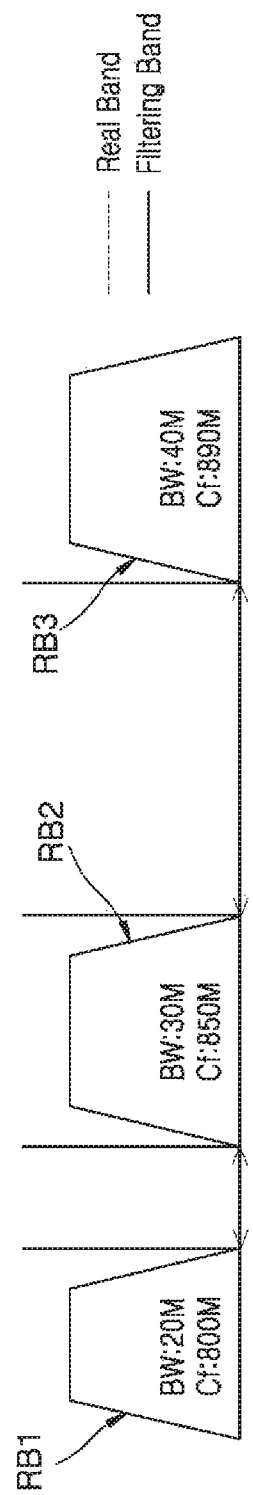
FIG. 2 is a diagram of frequency bands processed by the up-down converter shown in FIG. 1.
Figure 3:
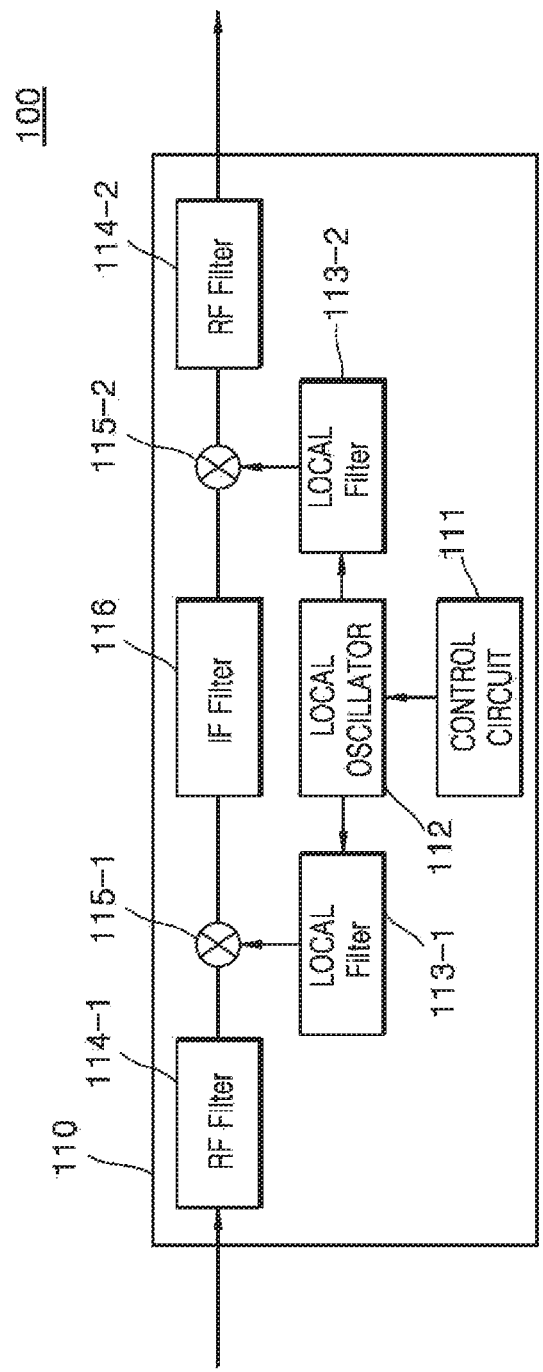
FIG. 3 is a schematic block diagram of a communication device including an up-down converter according to an embodiment of the inventive concept.
Figure 4:
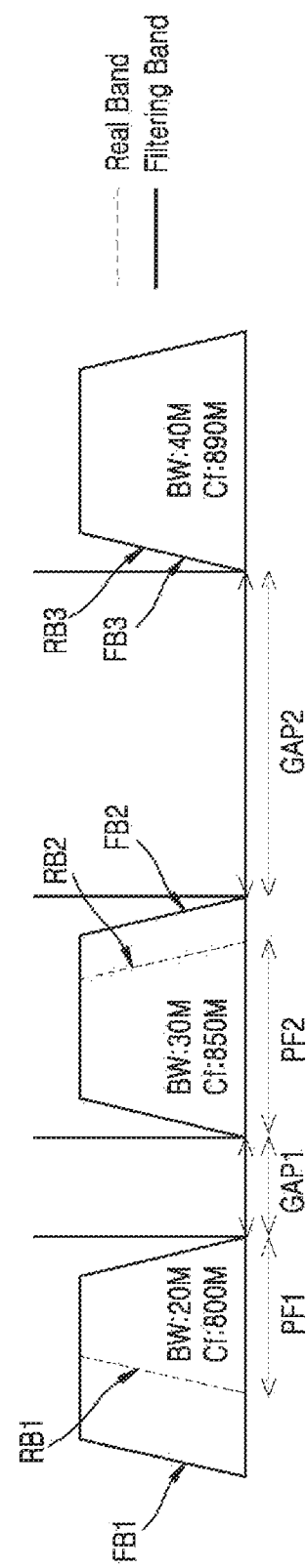
FIG. 4 is a diagram of frequency bands processed by the up-down converter shown in FIG. 3.

FIG. 3 is a schematic block diagram of a communication device including an up-down converter according to an embodiment of the inventive concept. FIG. 4 is a diagram of frequency bands processed by the up-down converter shown in FIG. 3.

Referring to FIGS. 3 and 4, a communication device 100 may include an up-down converter 110. Here, the communication device 100 may be a node unit, e.g., a headend unit linked to a base station or a remote unit linked to a user terminal, included in a distributed antenna system. Alternatively, the communication device 100 may be a repeater capable of wireless transmission, such as a radio frequency (RF) repeater or an interference cancellation system (ICS) repeater.

The up-down converter 110 may include a control circuit 111, a local oscillator 112, a first local filter 113-1, a second local filter 113-2, a first RF filter 114-1, a second RF filter 114-2, a first mixer 115-1, a second mixer 115-2, and an intermediate frequency (IF) filter 116.

In the communication device 100 shown in FIG. 3, an input RF signal including a plurality of frequency bands may be input to the up-down converter 110 without being separated.

The control circuit 111 may control the local oscillator 112 based on a frequency of the input RF signal to control the frequency of a first local signal used for down-conversion and of a second local signal used for up-conversion.

The local oscillator 112 may generate the first local signal and transmit the first local signal to the first local filter 113-1 under the control of the control circuit 111.

The local oscillator 112 may generate the second local signal and transmit the second local signal to the second local filter 113-2 under the control of the control circuit 111.

The first local filter 113-1 may filter the first local signal and transmit a filtered first local signal to the first mixer 115-1. In some embodiments, the first local filter 113-1 may be implemented as a band pass filter (BPF).

The second local filter 113-2 may filter the second local signal and transmit a filtered second local signal to the second mixer 115-2. In some embodiments, the second local filter 113-2 may be implemented as a BPF.

The first RF filter 114-1 may receive and filter the input RF signal and transmit a filtered input RF signal to the first mixer 115-1. In some embodiments, the first RF filter 114-1 may be implemented as a BPF. In other embodiments, the first RF filter 114-1 may pass all of a plurality of frequency bands RB1, RB2, and RB3.

The first mixer 115-1 may convert the filtered input RF signal received from the first RF filter 114-1 into an IF signal using the filtered first local signal received from the first local filter 113-1. In other words, the first mixer 115-1 may down-convert the input RF signal using the first local signal.

The IF filter 116 may filter the IF signal received from the first mixer 115-1 to pass a signal in a specific frequency band. In some embodiments, the IF filter 116 may be implemented as a BPF. The IF filter 116 may transmit a filtered IF signal to the second mixer 115-2. In some embodiments, the bandwidth of the IF filter 116 may be designed to be the same as or greater than the bandwidth of a frequency band having the greatest bandwidth among the plurality of frequency bands RB1, RB2, and RB3.

The second mixer 115-2 may convert the filtered IF signal received from the IF filter 116 into an output RF signal using the filtered second local signal received from the second local filter 113-2. In other words, the second mixer 115-2 may up-convert the filtered IF signal using the second local signal.

The second RF filter 114-2 may receive the output RF signal from the second mixer 115-2 and filter the output RF signal. The second RF filter 114-2 may filter out an image frequency which has occurred during the conversion of the second mixer 115-2. In some embodiments, the second RF filter 114-2 may be implemented as a BPF. In other embodiments, the second RF filter 114-2 may pass all of the plurality of frequency bands RB1, RB2, and RB3.

It is assumed that the first frequency band RB1 has a central frequency of 800 MHz and a bandwidth of 20 MHz, the second frequency band RB2 has a central frequency of 850 MHz and a bandwidth of 30 MHz, and the third frequency band RB3 has a central frequency of 890 MHz and a bandwidth of 40 MHz. In other words, it is assumed that a gap GAP1 between the first frequency band RB1 and the second frequency band RB2 is narrower than a gap GAP2 between the second frequency band RB2 and the third frequency band RB3.

In this case, all elements of the up-down converter 110 are designed to be suitable to operations in each of the frequency bands RB1, RB2, and RB3.

In some embodiments, the central frequency of local signals output from the local oscillator 112 may be controlled in a range of 700 to 790 MHz according to the frequency of an input RF signal.

In other embodiments, the local oscillator 112 may control the frequency of a first local signal and a second local signal so that the IF filter 116 passes a partial frequency section PF1 of a filtering band, e.g., FB1, to which an input RF signal belongs. The partial frequency section PF1 is at the side of the frequency band RB2 nearest to the frequency band RB1 of the input RF signal.

In still other embodiments, the local oscillator 112 may control the frequency of a first local signal and a second local signal so that the IF filter 116 passes a partial frequency section PF2 of a filtering band, e.g., FB2, to which an input RF signal belongs. The partial frequency section PF2 is at the side of the frequency band RB1 nearest to the frequency band RB2 of the input RF signal.

Accordingly, although a bandwidth, i.e., a filtering band FB1, FB2, or FB3 of the IF filter 116 is designed to be the same as or greater than a bandwidth (e.g., 40 MHz) of the frequency band, e.g., RB3, having the greatest bandwidth among the plurality of frequency bands RB1, RB2, and RB3, the IF filter 116 may perform filtering corresponding to a real band of each frequency band RB1, RB2, or RB3.

The first local filter 113-1 and the second local filter 113-2 may be designed to have a central frequency of 745 MHz and a bandwidth of 100 MHz.

The first RF filter 114-1 and the second RF filter 114-2 may be designed to have a central frequency of 850 MHz and a bandwidth of 120 MHz so that a pass frequency band ranges from 790 to 910 MHz. Accordingly, the first RF filter 114-1 and the second RF filter 114-2 may pass all of the plurality of frequency bands RB1, RB2, and RB3.

The IF filter 116 may be designed to have a central frequency of 100 MHz and a bandwidth of 40 MHz.

In other words, the bandwidth of the IF filter 116 may be designed to be the same as or greater than the bandwidth of the frequency band RB3 having the greatest bandwidth among the plurality of frequency bands RB1, RB2, and RB3.

As described above, according to embodiments of the present invention, the communication device 100 for supporting a plurality of frequency bands may have a structure which includes one up-down converter 110 which processes all of the plurality of frequency bands RB1, RB2, and RB3; the frequency of a first local signal and a second local signal, which needs to be adjusted according to each frequency band RB1, RB2, or RB3, may be controlled based on an input RF signal.

Although the communication device 100 processes three frequency bands RB1, RB2, and RB3 in the embodiments shown in FIGS. 3 and 4, the number of frequency bands which can be processed by the communication device 100 may be variously changed.

While the inventive concept has been particularly shown and described with reference to embodiments thereof, it will be understood that various changes in form and details may be made therein without departing from the spirit and scope of the following claims.

The invention claimed is:

1. An up-down converter comprising:
   a first mixer configured to convert an input radio frequency (RF) signal into an intermediate frequency (IF) signal using a first local signal;
   an IF filter configured to filter the IF signal converted by the first mixer;
   a second mixer configured to convert the IF signal, which has been filtered by the IF filter, into an output RF signal using a second local signal; and
   a local oscillator configured to control a frequency of the first local signal and the second local signal based on a frequency of the input RF signal,
   wherein the input RF signal comprises a plurality of frequency bands, and the local oscillator controls the frequency of the first local signal and the second local signal so that the IF filter passes a first frequency band from among the plurality of frequency bands through a partial frequency section of a filtering band of the IF filter,
   wherein the partial frequency section comprises one end frequency of the filtering band, the one end frequency being closer to a second frequency band than an opposite end frequency of the filtering band, and
   wherein the second frequency band is closer to the first frequency band than any other frequency band of the plurality of the frequency bands.

2. The up-down converter of claim 1, further comprising:
   a first local filter configured to filter the first local signal and to provide a filtered first local signal to the first mixer; and
   a second local filter configured to filter the second local signal and to provide a filtered second local signal to the second mixer.

3. The up-down converter of claim 1, wherein the local oscillator controls the frequency of the first local signal and the second local signal based on the input RF signal according to a control signal output from a control circuit.

4. The up-down converter of claim 1, further comprising:
   a first RF filter configured to filter the input RF signal and to transmit a filtered input RF signal to the first mixer; and
   a second RF filter configured to filter out an image frequency from the output RF signal.

5. The up-down converter of claim 4, wherein each of the first and second RF filters passes all of the plurality of frequency bands.

6. The up-down converter of claim 5, wherein a bandwidth of the IF filter is the same as or greater than a bandwidth of a frequency band having the greatest bandwidth among the plurality of frequency bands.

7. The up-down converter of claim 1, wherein a width of the partial frequency section is the same as a bandwidth of the first frequency band.

* * * * *